United States Patent [19]

Keller

[11] 4,361,716
[45] Nov. 30, 1982

[54] CURRENT LEAD-IN OF THE COAXIAL TYPE FOR SEALING TO A CONTAINER WALL

[75] Inventor: Wolfgang Keller, Munich, Fed. Rep. of Germany

[73] Assignee: Siemens Aktiengesellschaft, Berlin and Munich, Fed. Rep. of Germany

[21] Appl. No.: 147,748

[22] Filed: May 8, 1980

[30] Foreign Application Priority Data

May 17, 1979 [DE] Fed. Rep. of Germany ....... 2919988

[51] Int. Cl.³ .................. H05B 9/00; B01J 17/08; H01B 17/26
[52] U.S. Cl. .................. 373/147; 174/15 BH; 174/152 R
[58] Field of Search .............. 13/1, DIG. 1, 26, 27, 13/31; 174/152 R, 15 BH

[56] References Cited

U.S. PATENT DOCUMENTS

| 2,264,816 | 12/1941 | Treanor | 174/152 R |
| 2,675,414 | 4/1954 | Capita | 13/27 |
| 2,904,663 | 9/1959 | Emeis et al. | 13/DIG. 1 |
| 3,688,006 | 8/1972 | Keller | 13/DIG. 1 |
| 3,916,088 | 10/1975 | Keller | 13/DIG. 1 |
| 3,967,047 | 6/1976 | Long et al. | 13/17 |

FOREIGN PATENT DOCUMENTS 383472 12/1922 Fed. Rep. of Germany .......... 13/17
1916318 10/1970 Fed. Rep. of Germany .

Primary Examiner—Roy N. Envall, Jr.
Assistant Examiner—Bernard Roskoski
Attorney, Agent, or Firm—Herbert L. Lerner; Laurence A. Greenberg

[57] ABSTRACT

Current lead-in of the coaxial type, including at least two conducting tubes passing through a container wall, a gas-tight seal disposed between the tubes and the walls, an induction heating coil supplied with high frequency current from the tubes for producing a melting zone in a semiconductor rod, and a pressure-deformable electrically-insulating tension element disposed between the tubes. The tubes are in the form of an inner end and an outer tube. A pressure plate and a ring are disposed near one end of the inner tube, a ceramic tube surrounds the inner tube between the ring and the tension elements, and a ceramic ring stop is disposed at the other end of the inner tube. The ceramic tube and tension element have smaller outside diameters than the ring and stop and they are surrounded by the outer tube. Pressure is applied to the tension element by screws in the pressure plate or by a nut screwed onto the inner tube.

3 Claims, 2 Drawing Figures

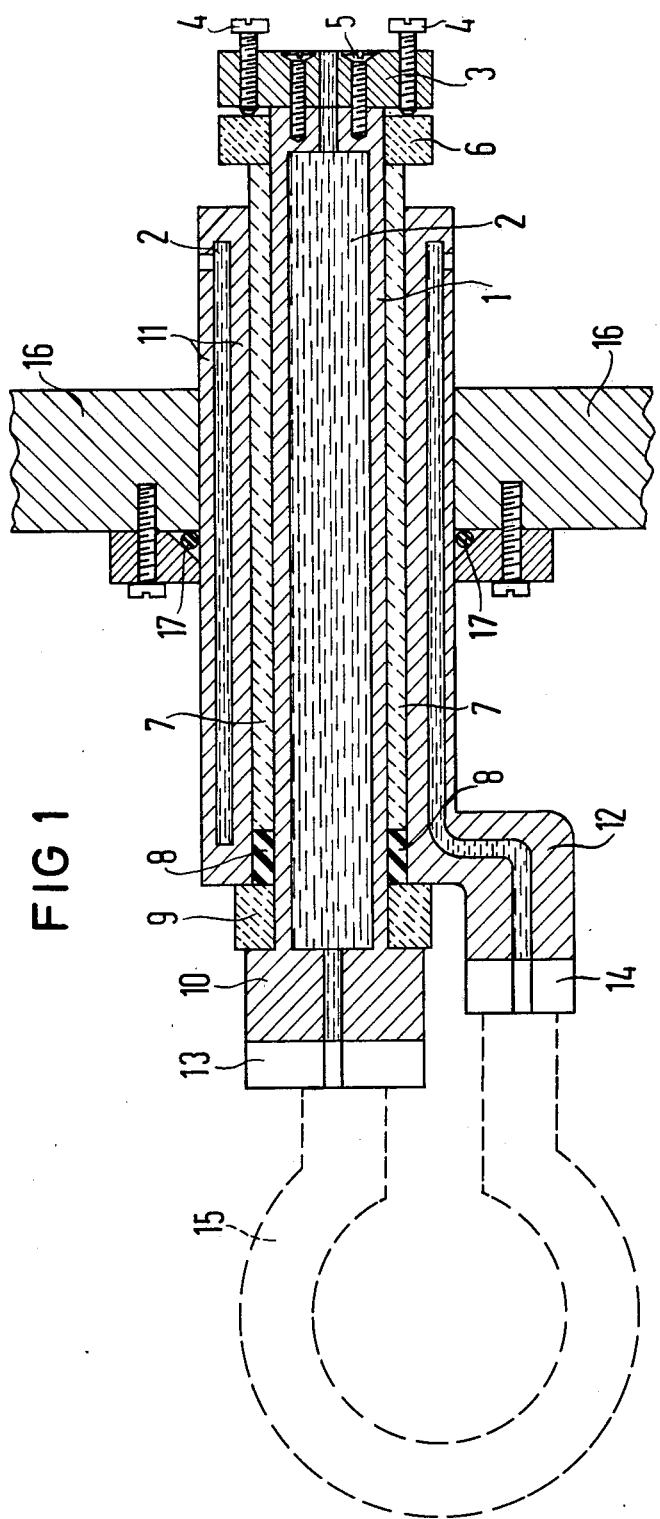

CURRENT LEAD-IN OF THE COAXIAL TYPE FOR SEALING TO A CONTAINER WALL

BACKGROUND OF THE INVENTION

1. Field of the Invention

The invention relates to a current lead-in of the coaxial type which comprises at least two conducting tubes, is carried through a container wall with a gas-tight seal, and which particularly serves for supplying a high frequency current to an induction heating coil that is used for producing a melting zone in a semiconductor rod.

2. Description of the Prior Art

The apparatus for the zone-melting of a crystalline semiconductor rod usually includes a container in which the semiconductor rod is supported, and wherein heating means in the form of an induction heating coil are disposed for heating the melting zone. The container is either evacuated, or filled with a protective gas. The heating means are supplied with alternating current from a high frequency generator. This heating current for the induction heating coil is supplied through a current lead-in, which is installed through the wall of the container. According to U.S. Pat. No. 3,688,006 this current lead-in contains two conductor tubes of different width or diameter. The tubes carry the induction heating coil and are coaxially disposed within each other due to their low inductance. An intermediate layer of elastic, cold or vulcanized silicon-rubber is used as the dielectric.

During the zone-melting of relatively thick semiconductor rods requiring relatively high power, relatively high power losses also occur in the current lead-in. Therefore during operation, small leakage points are formed between the intermediate layer of insulating material and the surface of the conducting tubes of the current lead-in, because the insulting material can easily break down by virtue of the heat load from the conducting tubes. The current intensity (amperage) in a zone-drawing operation for thick semiconductor rods can reach values of 500 to 1000 A at a frequency of approximately 3 MHz.

In German patent application No. P 28 23 611, which is also the subject of co-pending U.S. application Ser. No. 042,142 filed May 24, 1979 having the same inventor, a current lead-in is described wherein the silicon rubber is disposed around the inner conducting tube so that its layer-thickness increases conically in the direction toward the induction coil, and wherein an outer conducting tube is used which widens corresponding to the conical shape or form of the silicon rubber layer. In this way by press-fitting the two conducting tubes into each other, a seal and stop toward the outside is effected. The application of the silicon-rubber layer onto the inner conducting tube is performed in a mold which can be removed after the rubber has hardened. The casting or pouring device required for this procedure is, however, costly and the same applies for any repairs.

SUMMARY OF THE INVENTION

It is accordingly an object of the invention to provide a current lead-in of the coaxial type which overcomes the hereinafore-mentioned shortcomings of the heretofore known devices of this general type, and to provide a simple, and reliably-sealing, current lead-in which is easy to repair.

With the foregoing and other objects in view there is provided, in accordance with the invention, a current lead-in of the coaxial type, comprising at least two conducting tubes passing through a container wall, a gas-tight seal disposed between the tubes and the wall, an induction heating coil supplied with high frequency current from the tubes for producing a melting zone in a semiconductor rod, and a pressure-deformable electrically-insulating tension element disposed between the tubes.

In accordance with another feature of the invention, the tension element has an annular shape.

In accordance with a further feature of the invention, the tension element is formed of silicon rubber. Instead of silicon rubber, other elastic insulating materials which have good high frequency properties can also be used. The current lead-in according to the invention can be easily taken apart, so that it can be repaired if it should be damaged. By applying pressure onto the deformable tension element, a reliable seal for the current lead-in is assured in a simple manner.

In accordance with an added feature of the invention, there are provided screw means for applying pressure to the tension element.

In accordance with an additional feature of the invention, the screw means includes a ceramic tube for transmitting pressure to the tension element.

In accordance with yet another feature of the invention, the at least two conducting tubes comprise a liquid-cooled inner tube having two ends and a liquid-cooled outer tube, and there is provided a pressure plate disposed at one of the ends of the inner tube, a metal or ceramic ring coaxially surrounding the inner tube in vicinity of the one end thereof, a ceramic tube coaxially surrounding the inner tube between the ring and the tension element, a ceramic ring stop secured to and coaxially surrounding the other of the ends of the inner tube, and pressure screw means disposed in threaded holes formed in the pressure plate for applying pressure to the tension element through the ring and ceramic tube, the ceramic tube and tension element having a smaller outside diameter than the ring and ring stop, and the ceramic tube and tension element being coaxially surrounded by the outer tube.

In accordance with yet a further feature of the invention, the at least two conducting tubes comprise a liquid-cooled inner tube having two ends, an outer surface, and threads formed in the outer surface at least in vicinity of one of the ends thereof, and a liquid-cooled outer tube, and there is provided a ceramic tube coaxially surrounding the inner tube between the one end of the inner tube and the tension element, a ceramic ring stop secured to and coaxially surrounding the other of the ends of the inner tube, and a nut disposed on the threads for applying pressure to the tension element through the ceramic tube, the ceramic tube and tension element having a smaller outside diameter than the ring stop and nut, and the ceramic tube and tension element being coaxially surrounded by the outer tube.

Other features which are considered as characteristic for the invention are set forth in the appended claims.

Although the invention is illustrated and described herein as embodied in a current lead-in of the coaxial type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 1 is a fragmentary diagrammatic cross sectional view of a first embodiment of a current lead-in to an induction heating coil through the wall of a container according to the invention; for easier understanding, the high frequency generator which supplies the induction heating coil, and is connected to the end of the current lead-in which is located outside of the container, is not shown; and FIG. 2 is a fragmentary diagrammatic cross sectional view of the end portion of another embodiment of the invention.

Referring now to the figures of the drawing and first particularly to FIG. 1 thereof, it is seen that the current lead-in includes a metallic inner tube 1, which is cooled by a liquid medium 2, such as water. At the outer end of the inner tube 1, i.e. at the end which is outside the container, a metallic pressure plate 3 which comprises a duct for the cooling medium is fastened by screws 5, for example. Disposed in the pressure plate 3 are pressure-screws 4 which apply pressure onto a metal or ceramic ring 6 that surrounds the outer end of the inner tube 1, when they are turned. Adjacent to the metal or ceramic ring 6, the inner tube 1 is enclosed by a ceramic tube 7. Adjacent to the ceramic tube 7 is an annular tension element 8, which is made of an elastic material such as silicon rubber, for example. The tension element 8 and the ceramic tube 7 serve as the di-electric of the coaxial current lead-in, and have approximately the same outside diameter. The inner end of the inner tube 1, i.e. the end that is inside the container is fitted into a ceramic ring 9 which is adjacent to the tension element 8. The inner tube 1 is closed by a metal connecting-header 10 which serves as stop for any axial movement of the ring 9. The rings 6 and 9 have a greater outside diameter than the ceramic tube 7. The ceramic tube 7 and the annular tension element 8 are surrounded by a metallic outer tube 11 which is also cooled by a liquid medium 2 such as water, for example, similarly to the inner tube 1. At the inner end of the outer tube 11 there is provided a connecting-header 12 of metal. The melting-coil 15, shown with dotted lines in the figure, is attached to the connecting-headers 12 and 10 by means of the connecting members 13, 14, respectively, the high frequency generator and the cooling mechanism which are connected to the outer ends of the inner tube 1 and the outer tube 11 are not shown in the figure, for the sake of a clearer presentation.

The current lead-in extends through the wall 16 of a container which is not shown. A sealing element 17 such as an O-ring or a sealing ring serves for forming a seal between the current lead-in and the container wall 16. By turning the pressure screws 4, pressure is exerted on the annular tension element 8 by way of the metal or ceramic ring 6 and the ceramic tube 7. Therefore, annular element 8 increases its outside diameter and the inner tube 1 and the outer tube 11 are tensioned against each other, and thereby sealed as required.

In case it is not necessary to provide vertical mobility of the current lead-in relative to the container wall 16, it is also possible to secure the whole current lead-in in the container wall 16 by applying pressure onto the tension element 8.

FIG. 2 shows another embodiment of the outer end of the inner tube 1. This outside end is provided with a thread 19 so that the pressure onto the tension element 8 through the ceramic tube 7 can be directly effected by turning a nut 18.

It lies within the scope of the invention to choose other construction forms to apply pressure on the tension element 8. These allow a deformation of the element 8 in a manner which effects a reliable sealing of the current lead-in.

The metal parts of the device according to the invention can be made of any metal which is a good electrical conductor. The ceramic parts of the device can be manufactured of $Al_2O_3$, RF-Ceramic, quartz, glass, glass fiber reinforced plastic or the like. It is also possible to dispose the tension element 8 which effects the seal of the current lead-in at the outer end instead of the inner end, of the inner tube 1.

Because all parts of the current lead-in are only screwed together, and pushed onto each other, the apparatus can be taken apart in a simple manner for repair or similar purposes.

There are claimed:

1. Current lead-in of the coaxial type, comprising at least two conducting tubes passing through a container wall, a gas-tight seal disposed between said tubes and the wall, an induction heating coil supplied with high frequency current from said tubes for producing a melting zone in a semiconductor rod, a pressure-deformable electrically-insulating tension element disposed between said tubes, said at least two conducting tubes comprising a liquid-cooled inner tube having two ends and a liquid-cooled outer tube, a pressure plate disposed at one of said ends of said inner tube, a ring coaxially surrounding said inner tube in vicinity of said one end thereof, a ceramic tube coaxially surrounding said inner tube between said ring and said tension element, a ceramic ring stop secured to and coaxially surrounding the other of said ends of said inner tube, and pressure screw means disposed in threaded holes formed in said pressure plate for applying pressure to said tension element through said ring and ceramic tube, said ceramic tube and tension element having a smaller outside diameter than said ring and ring stop, and said ceramic tube and tension element being coaxially surrounded by said outer tube.

2. Current lead-in according to claim 1, wherein said ring is formed of a material from the group consisting of ceramic and metal.

3. Current lead-in of the coaxial type, comprising at least two conducting tubes passing through a container wall, a gas-tight seal disposed between said tubes and the wall, and induction heating coil supplied with high frequency current from said tubes for producing a melting zone in a semiconductor rod, a pressure-deformable electrically-insulating tension element disposed between said tubes, said at least two conducting tubes comprising a liquid-cooled inner tube having two ends, an outer surface, and threads formed in said outer surface at least in vicinity of one of said ends thereof, and a liquid-cooled outer tube, a ceramic tube coaxially surrounding said inner tube between said one end of said inner tube and said tension element, a ceramic ring stop secured to and coaxially surrounding the other of said ends of said inner tube, and a nut disposed on said threads for applying pressure to said tension element through said ceramic tube, said ceramic tube and tension element having a smaller outside diameter than said ring stop and nut, and said ceramic tube and tension element being coaxially surrounded by said outer tube.

* * * * *